(12) United States Patent
Kim et al.

(10) Patent No.: US 9,559,227 B2
(45) Date of Patent: Jan. 31, 2017

(54) NANOSTRUCTURE AND OPTICAL DEVICE INCLUDING THE NANOSTRUCTURE

(71) Applicants: SAMSUNG ELECTRONICS CO., LTD., Suwon-si (KR); UNIST Academy-Industry Research Corporation, Ulsan (KR)

(72) Inventors: Unjeong Kim, Osan-si (KR); Younggeun Roh, Seoul (KR); Yeonsang Park, Seoul (KR); Changwon Lee, Hwaseong-si (KR); Soojin Park, Ulsan (KR); Seungmin Yoo, Ulsan (KR)

(73) Assignees: SAMSUNG ELECTRONICS CO., LTD., Suwon-si (KR); UNIST (Ulsan National Institute of Science and Technology), Ulsan (KR)

( * ) Notice: Subject to any disclaimer, the term of this patent is extended or adjusted under 35 U.S.C. 154(b) by 0 days.

(21) Appl. No.: 14/744,449

(22) Filed: Jun. 19, 2015

(65) Prior Publication Data
US 2015/0372163 A1 Dec. 24, 2015

(30) Foreign Application Priority Data
Jun. 19, 2014 (KR) ........................ 10-2014-0075056

(51) Int. Cl.
*H01L 31/0232* (2014.01)
*H01L 31/0352* (2006.01)
*H01L 31/0224* (2006.01)
*H01L 31/028* (2006.01)
*H01L 31/032* (2006.01)

(52) U.S. Cl.
CPC ....... *H01L 31/02327* (2013.01); *H01L 31/028* (2013.01); *H01L 31/0224* (2013.01); *H01L 31/032* (2013.01); *H01L 31/0352* (2013.01); *Y10T 428/24802* (2015.01); *Y10T 428/24917* (2015.01)

(58) Field of Classification Search
CPC .......... H01L 31/02327; H01L 31/0224; H01L 31/028; H01L 31/032; H01L 31/0352
See application file for complete search history.

(56) References Cited

U.S. PATENT DOCUMENTS

| 7,033,415 | B2 | 4/2006 | Mirkin et al. |
| 2012/0132930 | A1* | 5/2012 | Young ................ H01L 31/0481 257/84 |
| 2014/0225067 | A1 | 8/2014 | Kim et al. |

(Continued)

FOREIGN PATENT DOCUMENTS

| KR | 10-0837046 B1 | 6/2008 |
| KR | 10-2011-0083939 A | 7/2011 |

(Continued)

*Primary Examiner* — Whitney T Moore
(74) *Attorney, Agent, or Firm* — Sughrue Mion, PLLC

(57) ABSTRACT

Provided are a nanostructure and an optical device including the nanostructure. The nanostructure is formed on a two-dimensional material layer such as graphene and includes nanopatterns having different shapes. The nanopattern may include a first nanopattern and a second nanopattern and may be spherical; cube-shaped; or poly-pyramid-shaped, including a triangular pyramid shape; or polygonal pillar-shaped.

13 Claims, 7 Drawing Sheets

(56) References Cited

U.S. PATENT DOCUMENTS

| | | | |
|---|---|---|---|
| 2015/0122320 A1* | 5/2015 | Wu | .................. H01L 21/02376 |
| | | | 136/256 |
| 2015/0123079 A1 | 5/2015 | Kim et al. | |
| 2016/0035838 A1* | 2/2016 | Yi | ........................... F28D 15/02 |
| | | | 257/9 |

FOREIGN PATENT DOCUMENTS

| | | |
|---|---|---|
| KR | 10-1249958 B1 | 4/2013 |
| KR | 10-2015-0053157 A | 5/2015 |

* cited by examiner

NANOSTRUCTURE AND OPTICAL DEVICE INCLUDING THE NANOSTRUCTURE

RELATED APPLICATION

This application claims priority from Korean Patent Application No. 10-2014-0075056, filed on Jun. 19, 2014, in the Korean Intellectual Property Office, the disclosure of which is incorporated herein in its entirety by reference.

BACKGROUND

1. Field

Apparatuses and methods consistent with exemplary embodiments relate to nanostructures and optical devices including the nanostructures, and more particularly, to a plurality of nanostructures formed on a two-dimensional material layer and having different shapes, and optical devices including the nanostructures.

2. Description of the Related Art

Since a graphene synthesis methods have been developed, research has been conducted into ways in which to use graphene in conjunction with electronic and optical devices. Graphene has stable electric, mechanical, and chemical characteristics and excellent conductive characteristics, and thus, research has also been conducted into the development of nanodevices utilizing graphene.

Graphene is a carbon nanomaterial in the form of a single atom layer in which carbon atoms are connected in the plane of the layer in a hexagonal shape. Graphene conducts electricity 100 or more times faster than single crystalline silicone which is frequently used in semiconductor devices, and theoretically, graphene has a mobility of $2 \times 10^5$ cm$^2$/Vs. Thus, as graphene can, without problem, conduct electricity at rates up to 100 times higher than are possible using copper, graphene is beginning to be regarded as a basic material for use in the construction of electronic circuits.

Due to these various advantages of graphene, research is being conducted into the use of graphene with various electronic and optoelectronic devices and optoelectronic. Research is also being conducted into the development of optical devices that utilize photocurrent generated in graphene. However, it is difficult to form nanostructure patterns on graphene, and thus, it has been difficult to manufacture devices in which graphene is used.

SUMMARY

One or more exemplary embodiments may provide nanostructures including a nanopattern formed on a two-dimensional material layer.

One or more exemplary embodiments may provide optical devices including a nanostructure formed on a two-dimensional material layer.

Additional exemplary aspects and advantages will be set forth in part in the description which follows and, in part, will be apparent from the description, or may be learned by practice of the presented embodiments.

According to an aspect of an exemplary embodiment, a nanostructure comprising: a two-dimensional material layer; and a plurality of nanopatterns that are formed on the two-dimensional material layer and have different shapes.

One of the plurality of nanopatterns may have a spherical shape; a cube shape; a poly-pyramid shape, including a triangular pyramid shape; or a polygonal pillar shape.

The plurality of nanopatterns may comprise: a plurality of first nanopatterns; and a plurality of second nanopatterns having a different shape from the plurality of first nanopatterns.

The first nanopatterns and the second nanopatterns may be formed of same material.

The first and second nanopatterns may have different shapes or different sizes.

The first nanopatterns may be spherical and the second nanopatterns may be rod-shaped.

The plurality of nanopatterns may be formed of Au, Ag, Cu, Cr, Pt, Pd, or an alloy thereof.

According to an aspect of another exemplary embodiment, an optical device comprising: a two-dimensional material layer; a plurality of nanopatterns that are formed on the two-dimensional material layer and have different shapes; and a first electrode and a second electrode contacting the two-dimensional material layer.

According to an aspect of another exemplary embodiment, a method of manufacturing a nanostructure, the method comprising: preparing a solvent in which a block copolymer is dissolved; adding a metal precursor to the solvent; and reducing the metal precursor to nanopatterns having different shapes by adding a reducing agent to the solvent.

The solvent may be a mixture solution including tetrahydrofuran (THF) that is contained in at least one of toluene, xylene, and ethylbenzene.

In the solvent, a mixture ratio of toluene, xylene or ethylbenzene with respect to THF may be about 10:90 to about 90:11) vol %.

The block copolymer may be PS-b-P2VP, and in the solvent, a mixture ratio of toluene, xylene, or ethylbenzene with respect to THF may be about 10:90 to about 50:50 vol %.

The block copolymer may be PS-b-P2VP, and in the solvent, a mixture ratio of toluene, xylene, or ethylbenzene with respect to THF may be about 50:50 to about 90:10 vol %.

According to an aspect of another exemplary embodiment, a method of manufacturing a nanostructure, the method comprising: forming a metal seed; adding a precursor of nanopatterns and a direction indicator to a solution including the metal seed; and reducing the precursor to form a plurality of nanopatterns having different shapes.

The metal seed may be formed by adding a metal precursor to a solution.

The nanopatterns may be formed of a material including Ag, and the metal seed may be formed of a material including Au.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
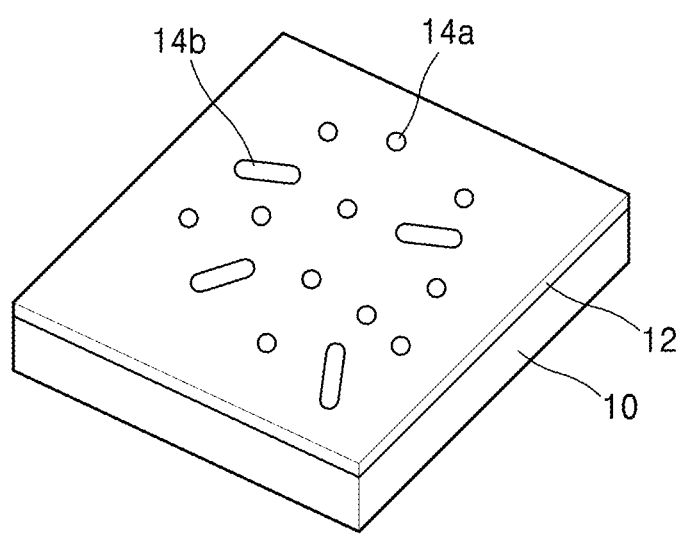
FIG. 1 illustrates a nanostructure according to an exemplary embodiment.

Reference will now be made in detail to exemplary embodiments which are illustrated in the accompanying drawings, wherein like reference numerals refer to like elements throughout. In this regard, the present embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In the drawings, widths or thicknesses of layers or areas illustrated in the attached drawings may be exaggerated for clarity of the specification. Throughout the specification, like reference numerals denote like elements. Meanwhile, the embodiments described below are merely exemplary and may include various modifications. It will also be understood that when an element is referred to as being "on" another element, it can be directly on the other element, or intervening elements may also be present.

FIG. 1 illustrates a nanostructure according to an exemplary embodiment. Referring to FIG. 1, the nanostructure may include a lower structure 10, a two-dimensional material layer 12 formed on the lower structure, and nanopatterns 14a and 14b formed on the two-dimensional material layer 12.

The lower structure 10 may be an object on which a nanostructure according to an embodiment is formed, and may be a substrate formed of any of various materials. Examples of the substrate include a glass substrate, a polymer substrate or a semiconductor substrate such as silicon. Also, the substrate may be a conductive substrate, such as metal or a conductive metal compound, or may be an insulating substrate, such as a silicon oxide or a silicon nitride. Also, the substrate may be transparent, opaque, or semi-transparent.

The two-dimensional material layer 12 may have a single-layer structure or a half-layer structure in which atoms have a predetermined crystalline structure, or may have a structure formed of multiple atom layers. The two-dimensional material layer 12 may include a carbon nanomaterial or a metal chalcogenide based material. The metal chalcogenide based material may be a transition metal dichalcogenide (TMDC) material including a transition metal and a chalcogen material. The transition metal may be at least one of Mo, W, Nb, V, Ta, Ti, Zr, Hf, Tc or Re, and the chalcogen material may be at least one of S, Se, and Te. The TMDC material may be represented by, for example, a formula of $MX_2$. M may be a transition metal such as Mo, W, Nb, V, Ta, Ti, Zr, Hf, Tc, or Re, and X may be a chalcogen element such as S, Se, or Te. In detail, the TMDC material may be $MoS_2$, $MoSe_2$, $MoTe_2$, $WS_2$, $WSe_2$, $WTe_2$, $ZrSe_2$, $HfS_2$, $HfSe_2$, $NbSe_2$, $ReSe_2$ or the like. Also, the metal chalcogenide based material may not be represented by CuS. For example, a transition metal chalcogenide material such as a compound formed of Cu, which is a transition metal, and S, which is a chalcogen element, may be represented by CuS. The carbon nanomaterial may include graphene, the graphene may be in the form of a planar sheet in which carbon atoms are connected in a hexagonal shape. The two-dimensional material layer 12 may include a single-layer of graphene or multiple layers of graphene. The graphene layer may be directly formed on the lower structure 10. Also, the graphene layer may be formed on a substrate other than the lower substrate 10 using a chemical vapor deposition (CVD) method or a pyrolysis method and may then be transferred onto the lower structure 10.

The nanopatterns 14a and 14b may be formed of Au, Ag, Cu, Cr, Pt, Pd or an alloy thereof or of other metals. The nanopatterns 14a and 14b may include a first nanopattern 14a and a second nanopattern 14b. The first nanopattern 14a and the second nanopattern 14b may be formed of the same material. For example, if the first nanopattern 14a is formed of Ag, the second nanopattern 14b may also be formed of Ag, and if the first nanopattern 14a is formed of a material including Au and Ag, the second nanopattern 14b may also include Au and Ag.

The nanopatterns 14a and 14b may have any of various shapes, and may be, for example, spherical; cube-shaped; or polygonal, including a triangular pyramid shape, or polygonal pillar-shaped. Also, the nanopatterns 14a and 14b may be rod-shaped and have a length that is longer than a cross-sectional width thereof. Examples of cross-sectional shapes of such rod-shaped nanopatterns are not limited and may be a circle, an oval, or a polygon. Also, the nanopatterns 14a and 14b may have the same shapes but different sizes. In the nanostructure according to the present embodiment, the nanopatterns 14a and 14b may have different shapes, that is, may include nanopatterns that have different forms or different sizes. For example, the first nanopattern 14a may be spherical, and the second nanopattern 14b may be rod-shaped, as shown in FIG. 1. Surface plasmon that are generated in a nanometer-sized metal structure, such as the nanopatterns 14a and 14b, are referred to as localized surface plasmon resonance (LSPR), and an LSPR frequency may vary according to the shape of the nanopatterns 14a and 14b. For example, a spherical nanopattern formed of Ag may have a plasmon resonance range of about 320 nm to about 450 nm, and a rod-shaped nanopattern may have a plasmon resonance range of about 380 nm to about 460 nm or from about 350 nm to about 900 nm according to a cross-section thereof. As the nanopatterns 14a and 14b have different shapes as described above, for example, if the nanopatterns are used in a photodetector, a multi-band photodetector may be implemented.

Hereinafter, a method of manufacturing a nanostructure according to an exemplary embodiment will be described with reference to the drawings.

Figure 3:
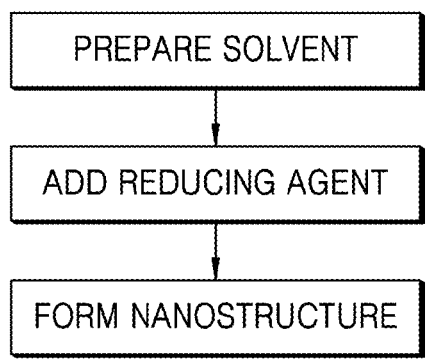
FIG. 3 illustrates a method of manufacturing a nanostructure according to an exemplary embodiment.

FIG. 3 illustrates a method of manufacturing a nanostructure according to an exemplary embodiment.

Referring to FIG. 3, in order to form nanopatterns in various forms, a solvent is prepared. The solvent may be a polymer solution in which a block copolymer is dissolved.

The block copolymer may include a first polymer which is hydrophobic and a second polymer which is hydrophilic. The block copolymer may be at least one of the materials listed below:

PS-b-P4VP: polystyrene-block-poly(4-vinylpyridine),
PS-b-P2VP: polystyrene-block-poly(2-vinylpyridine),
PS-b-PEO: polystyrene-block-poly(ethylene oxide),
PS-b-PAA: polystyrene-block-poly(acrylic acid),
PI-b-P4VP: polyisoprene-block-poly(4-vinylpyridine),
PI-b-P2VP: polyisoprene-block-poly(2-vinylpyridine),
PI-b-PEO: polyisoprene-block-poly(ethylene oxide),
PI-b-PAA: polyisoprene-block-poly(acrylic acid),
PMMA-b-P4VP: poly(methyl methacrylate)-block-poly(4-vinylpyridine),
PMMA-b-P2VP: poly(methyl methacrylate)-block-poly(2-vinylpyridine),
PMMA-b-PEO: poly(methyl methacrylate)-block-poly(ethylene oxide),
PMMA-b-PAA: poly(methyl methacrylate)-block-poly(acrylic acid),
PS-b-PMA: polystyrene-block-poly(methacrylic acid),
PS-b-PMMA: polystyrene-block-poly(methyl methacrylate),
PI-b-PMA: polyisoprene-block-poly(methacrylic acid),
PI-b-PMMA: polyisoprene-block-poly(methyl methacrylate),
PMMA-b-PMA: poly(methyl methacrylate)-block-poly(methacrylic acid),
PS-b-PS-OH: polystyrene-block-poly(hydroxylstyrene), and
PI-b-PS-OH: polyisoprene-block-poly(hydroxylstyrene).

The solvent in which the block copolymer is dissolved may be a hydrophobic solvent. For example, toluene, xylene or ethylbenzene may be used as the solvent, or a solvent mixture including tetrahydrofuran (THF) in at least one of toluene, xylene, and ethylbenzene may be used as the solvent. Regarding the solvent mixture, a mixture ratio of toluene, xylene or ethylbenzene with respect to THF may be about 10:90 to about 90:10 vol %. A mixture ratio of the solvent mixture may be adjusted according to a type of the block copolymer. For example, if the block copolymer is PS-b-P4VP, a mixture ratio of toluene, xylene or ethylbenzene with respect to THF may be about 10:90 to about 50:50 vol %, and the solvent mixture may be used within a range from about 20:80 to about 040:60 vol %. Also, if the block copolymer is PS-b-P2VP, a mixture ratio of toluene, xylene or ethylbenzene with respect to THF may be about 50:50 to about 90:10 vol %. By using, for example, a solvent mixture of toluene and THF as the solvent, nanopatterns having both a spherical shape and a rod shape may be formed at the same time. By using toluene as the solvent, nanopattern having a spherical shape may be formed. And by using THF as the solvent, nanopattern having a rod shape may be formed.

The block copolymer may include a first polymer which is hydrophobic and a second polymer which is hydrophilic. For example, in PS-b-P4VP, "PS" may be the first polymer which is hydrophobic, and "P4VP" may be the second polymer which is hydrophilic. Also, in PS-b-P2VP, "PS" may be the first polymer which is hydrophobic, and "P2VP" may be the second polymer which is hydrophilic. When the block copolymer including the first polymer and the second polymer is dissolved in a hydrophobic solvent, a micelle of the block copolymer may be formed. The micelle may include a core including the second polymer (for example, P4VP or P2VP) and a shell including the first polymer (for example, PS).

Also, a metal precursor of 0.5 to 1 equivalent weight is added to the solvent. The metal may be, for example, Au, Ag, Cu, Cr, Pt, Pd or an alloy thereof. When the metal is Au, for example, $AuCl_4$, $HAuCl_4$ or $LiAuCl_4$ may be used as a precursor. When the metal is Ag, for example, $Ag(ClO_4)$, $AgNO_3$ or $AgCF_3COO$ may be used as a precursor. Also, when the metal is Cu, for example, $CuCl_2$, $Cu(NO_3)_2$, or $CuSO_4$ may be used as a precursor. In addition, $C_{10}H_{14}O_4Pt$, $K_2PdCl_4$, $(NH_4)_2PdCl_4$, $Pd(NO_3)_2$, $CrCl_3$ or the like may be used as a precursor. When the metal precursor is dipped into the solvent and stirred, the metal precursor may be combined with the micelle of the block copolymer. A material of the metal precursor may be combined with the core of the micelle of the block copolymer. The core of the micelle may have a functional group with which a material of the metal precursor may be combined, and thus, the material of the metal precursor may be combined with the core of the micelle of the block copolymer. As a result, the material of the metal precursor may have a pattern having the same arrangement and form as those of the core of the micelle of the block copolymer.

Figure 5:
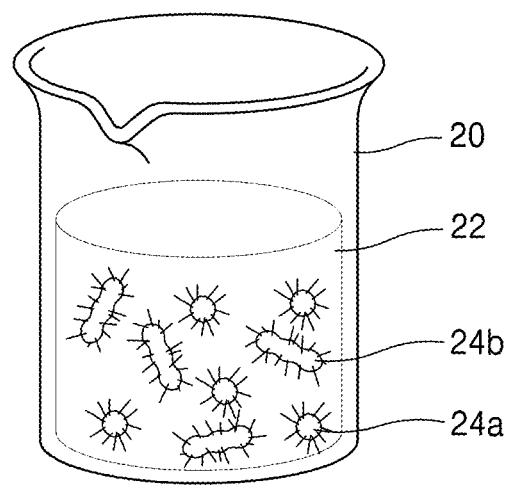
FIG. 5 illustrates an operation of manufacturing a nanostructure according to an exemplary embodiment.

In addition, a reducing agent may be put into the solvent including the metal precursor. A small amount of the reducing agent may be added to the solvent, and for example, about several wt % to about 30 wt % of the metal precursor may be added. Examples of the reducing agent are hydrazine, $NaBH_4$, and ascorbic acid. By adding the reducing agent to the solvent, the metal precursor material combined with the micelle of the block copolymer may be reduced to form a nanopattern having a predetermined shape. FIG. 5 illustrates an operation included in the manufacturing a nanostructure according to an exemplary embodiment. Referring to FIG. 5, a solvent 22 is contained in a container 20, and when a reducing agent is input thereto to reduce a metal precursor, a first nanopattern 24a having a sphere shape and a second nanopattern 24b having rod-shaped may be coexistent in the solvent 22. A nanostructure may be formed by coating the two-dimensional material layer 12 with the solvent including nanopatterns in any of various forms and drying the two-dimensional material layer 12.

Figure 2:
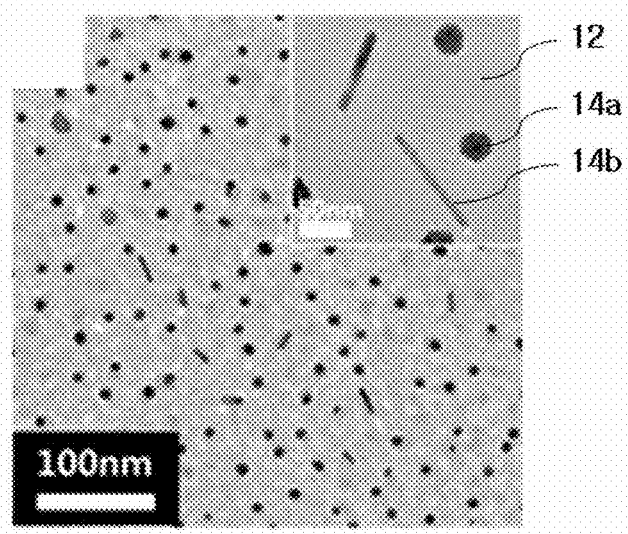
FIG. 2 is a transmission electron microscopy (TEM) image showing nanopatterns in various forms.

FIG. 2 is a transmission electron microscopy (TEM) image showing nanopatterns in various forms. Regarding the metal nanopatterns of FIG. 2, a 0.5% of Ps-b-P4VP was added as a block copolymer into a solvent mixture whose mixture ratio of toluene and THF was 30:70 vol %, $AgNO_3$ was added as a metal precursor, and the solution was stirred, followed by the addition of hydrazine as a reducing agent to reduce Ag. After the reduction operation, Ag has both a spherical shape and a rod-shape.

A solvent including metal nanopatterns having various forms may be coated on the two-dimensional material layer 12 by using, for example, a spin coating method, and may then be dried. Accordingly, the micelle layer of the block copolymer on the two-dimensional material layer 12 may be removed, and the reduced metal nanopatterns 14a and 14b may be distributed on the two-dimensional material layer 12 or may be arranged in a ring shape. Each of the nanopatterns 14a and 14b may have a size of about several dozens to about several hundreds of nm. Selectively, an operation of coating the nanopatterns 14a and 14b with a metal material may be further performed. Accordingly, the nanopatterns 14a and 14b are connected to each other in a continuous structure. When an additional coating operation is performed, a plating operation may also be performed, and a reduction reaction may be used in the plating operation. Also, electrodeless plating (also called chemical plating) may be used in the plating operation.

Figure 4:
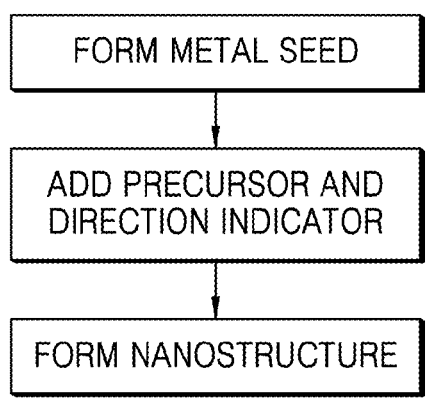
FIG. 4 illustrates a method of manufacturing a nanostructure according to an exemplary embodiment.

FIG. 4 illustrates a method of manufacturing a nanostructure according to another exemplary embodiment.

Referring to FIG. 4, in order to form a nanopattern, a metal seed may be formed of a material having a crystalline structure similar to that of a material for forming a nanopattern. A precursor of the metal seed material is added to a solvent to form a metal seed. For example, when it is desired that the nanopattern be formed of Ag, the metal seed may be formed of Au, and an Au precursor may be added into an ethylene glycol solvent to form the metal seed. The Au precursor may be, for example, $AuCl_4$, $HAuCl_4$ or $LiAuCl_4$.

Also, a metal precursor and a direction indicator, which are materials of a nanopattern, may be added to the solvent in which the metal seed is formed. The nanopattern may be formed of, for example, Au, Ag, Cu, Cr, Pt, Pd or an alloy thereof. When it is desired that the nanopattern be formed of Au, for example, $AuCl_4$, $HAuCl_4$ or $LiAuCl_4$ may be used as a metal precursor. When it is desired that the nanopattern be formed of Ag, for example, $Ag(ClO_4)$, $AgNO_3$ or $AgCF_3COO$ may be used as a metal precursor. Also, when it is desired that the nanopattern be formed of Cu, for example, $CuCl_2$, $Cu(NO_3)_2$, or $CuSO_4$ may be used as a metal precursor. In addition, $C_{10}H_{14}O_4Pt$, $K_2PdCl_4$, $(NH_4)_2PdCl_4$, $Pd(NO_3)_2$, $CrCl_3$ or the like may be used as a metal precursor. The direction indicator is a compound that blocks a predetermined surface of the metal seed to induce growth in a desired direction. Examples of the direction indicator include poly(vinyl pyrrolidone) (PVP), citrate, cetyltrimethylammonium bromide (CTAB), and cetyltrimethylammonium chloride (CTAC).

A metal nanopattern having a greater aspect ratio may be formed if the size of the metal seed is smaller, and a metal nanopattern having a smaller aspect ratio may be formed if the size of the metal seed is greater. When a metal precursor and a direction indicator are added, a solvent and a reducing agent may be additionally added, and for example, ethylene glycol may be used, which may function as both a solvent and a reducing agent. As the metal precursor is reduced, the metal seed may form into metal patterns in various shapes according to a size of the metal seed. For example, spherical nanopatterns and rod-shaped nanopatterns, having relatively large aspect ratios, may coexist. In addition, a solvent including a metal pattern may be centrifuged with $H_2O$ and/or ethanol and then dried. By coating the nanopatterns formed as above on a two-dimensional material layer, a nanostructure may be formed according to the current exemplary embodiment.

Figure 6:
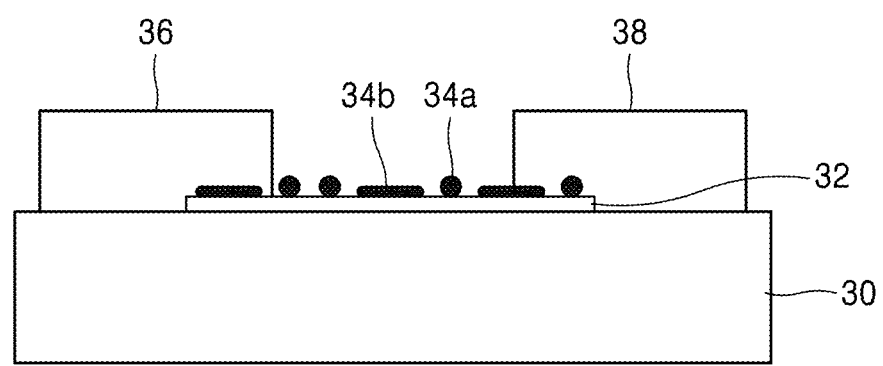
FIG. 6 is a cross-sectional view illustrating an optical device including a nanostructure according to an exemplary embodiment.

FIG. 6 is a cross-sectional view illustrating a nanostructure and an optical device including the nanostructure according to an exemplary embodiment. The optical device may be a photodetector or a multi-band plasmonic photodetector.

Referring to FIG. 6, a two-dimensional material layer 32 may be formed on a lower structure 30. Also, nanopatterns 34a and 34b, in various shapes, may be formed on the two-dimensional material layer 32. The nanopatterns 34a and 34b may be formed using the above-described operations, and a solvent including the nanopatterns 34a and 34b may be coated on the two-dimensional material layer 32 using, for example, a spin coating method or a drop casting method, and then the two-dimensional material layer 32 may be dried. Also, a first electrode 36 and a second electrode 38 contacting the two-dimensional material layer 32, on which the nanopatterns 34a and 34b are formed, may be included. The lower structure 30 may be a substrate, and the two-dimensional material layer 32 may be graphene. Also, the first electrode 36 may be a source, and the second electrode 38 may be a drain.

A photocurrent, generated by light that is irradiated onto the two-dimensional material layer 32 and the nanopatterns 34a and 34b, having various forms, through the first electrode 36 and the second electrode 38, may be detected.

Figure 7A:
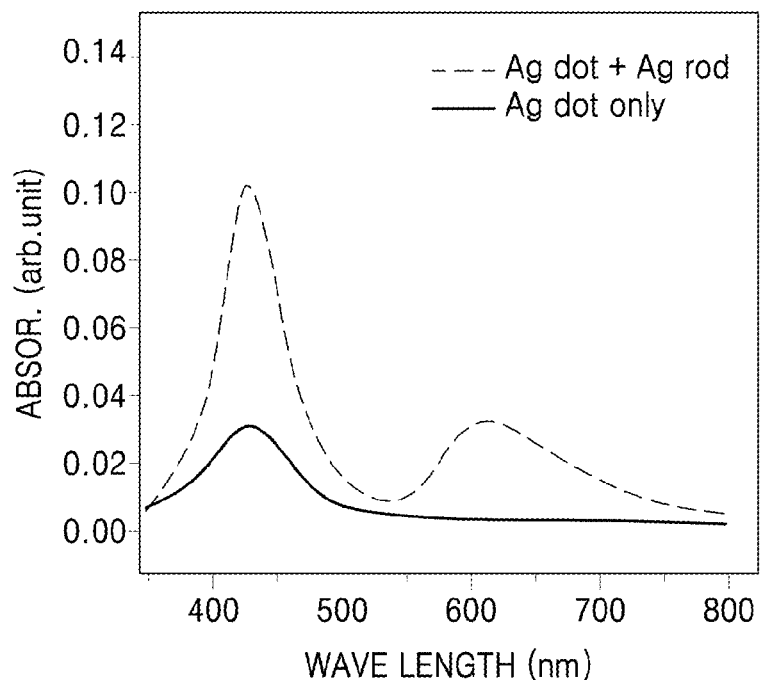
FIG. 7A is a graph showing an absorbance spectrum of an optical device according to an exemplary embodiment.

FIG. 7A is a graph showing a surface Plasmon band of a nanostructure according to an exemplary embodiment. Here, an absorbance of a graphene layer, on which only spherical Ag nanopatterns (Ag dots) are formed, and an absorbance of a graphene layer, on which both spherical and rod-shaped Ag nanopatterns (Ag dots and Ag rods) are formed, are shown.

Referring to FIG. 7A, the absorbance increases in a section between 400 nm and 450 nm when only spherical Ag nano patterns (Ag dots) are formed on a graphene layer and when both spherical and rod-shaped Ag nanopatterns (Ag dots and Ag rods) are formed. However, in a wavelength range around about 600 nm, the absorbance increases only when both spherical and rod-shaped Ag nanopatterns (Ag dots and Ag rods) are formed.

Figure 7B:
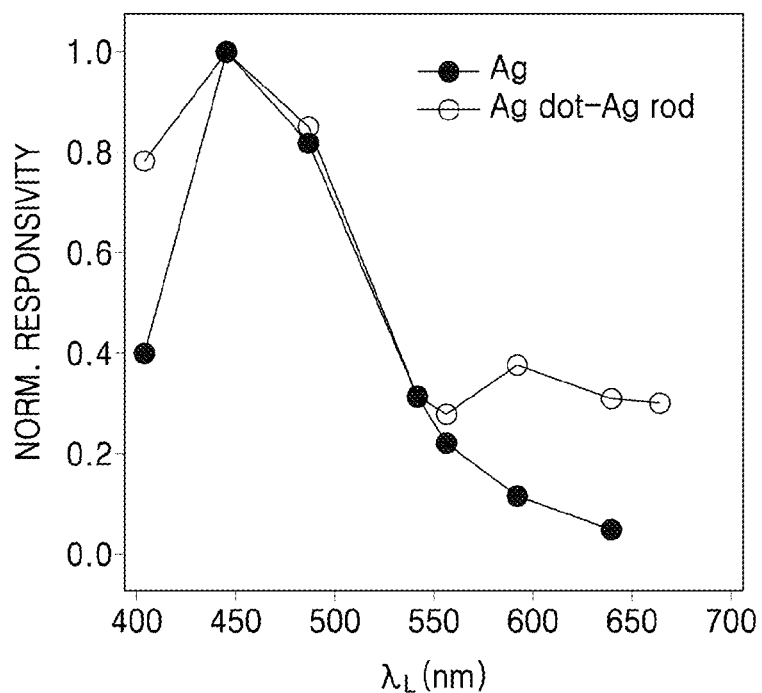
FIG. 7B is a graph showing photocurrent characteristics of an optical device according to an exemplary embodiment.

FIG. 7B is a graph showing photocurrent characteristics of an optical device according to an exemplary embodiment. In FIG. 7B, a laser having a power less than 1 mW was irradiated onto a graphene layer and an electrode bonding portion (Cr and Au electrodes) to measure a photocurrent. A photocurrent per unit energy was calculated by dividing the photocurrent by laser power. Referring to FIG. 7B, a tendency of the photocurrent per unit energy according to a wavelength was similar to a tendency of the absorbance spectrum. As a result, a photocurrent was generated by surface plasmon absorbance of a photoelectric device illustrated in FIG. 6.

Figure 8:
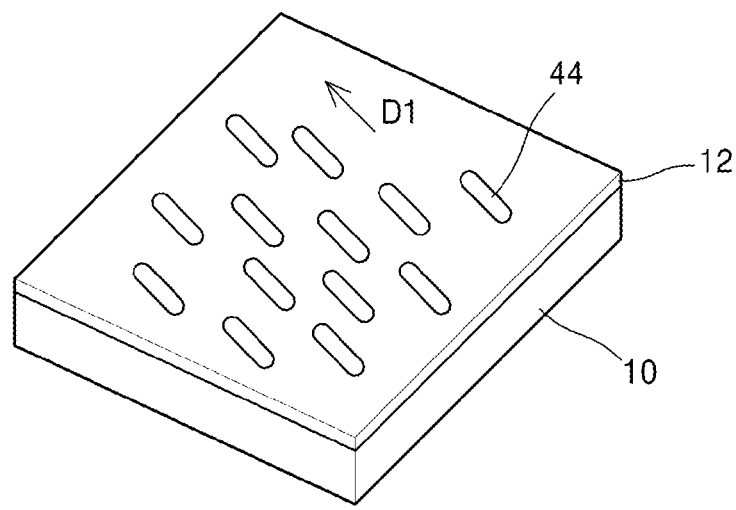
FIG. 8 illustrates a nanostructure including nanopatterns formed in a direction.

FIG. 8 illustrates a nanostructure including nanopatterns formed in a direction.

Referring to FIG. 8, the nanostructure may include a lower structure 10, a two-dimensional material layer 12 formed on the lower structure 10, and nanopatterns 44 that are formed on the two-dimensional material layer 12 substantially in one direction D1. The nanopatterns 44 may have a rod shape having a longer length with respect to a width of a cross-section, and the cross-section of the nanopatterns 44 may be, without limitation, a circle, an oval, or a polygon.

The nanopatterns 44 formed substantially in one direction D1 may indicate that at least 50% of the nanopatterns 44 are uniformly aligned lengthwise in the direction D1. Lengths of the nanopatterns 44, which are rod-shaped, and diameters or surface areas of the cross-sections of the nanopatterns 44 do not necessarily have to be identical. For example, the nanopatterns 44 may include rod-shaped nanopatterns having cross-sections of substantially the same size but both a relatively long length and a relatively short length. Also, although the nanopatterns 44 have substantially the same length, the nanopatterns 44 may have cross-sections of different shapes or different cross-section diameters or different surface areas. When the nanopatterns 44 are aligned substantially in the same direction D1 and include nanopatterns having different lengths or having cross-sections of different surface areas or different diameters, the nanopatterns 44 may be applied to a multi-band plasmonic photodetector. Although only the nanopatterns 44 which are rod-shaped are illustrated in FIG. 8, the shape of the nanopatterns is not limited thereto, and nanopatterns of a different shape, for example, spherical nanopatterns may also be partially included.

When the nanopatterns 44 are formed substantially in one direction D1 as described above, light absorbance may vary according to a polarization direction of incident light. For example, the more similar a polarization direction of light incident to the nanopatterns 44 is to the direction D1 which is the alignment direction of the nanopatterns 44, the more effectively a plasmonic band may be formed, thereby increasing light absorbance. On the other hand, the closer the polarization direction of light incident to the nanopatterns 44 is to a perpendicular direction to the direction D1 which is the alignment direction of the nanopatterns 44, light absorbance may be reduced.

Figure 9:
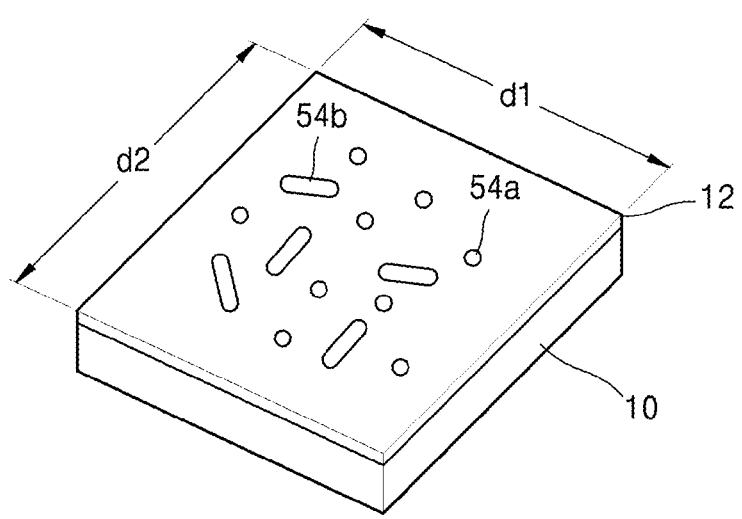
FIG. 9 illustrates a nanostructure in which distances between nanopatterns are adjustable.

FIG. 9 illustrates a nanostructure in which distances between nanopatterns are adjustable.

Referring to FIG. 9, the nanostructure may include a lower structure 10, a two-dimensional material layer 12 formed on the lower structure 10, and nanopatterns 54a and 54b formed on the two-dimensional material layer 12, wherein distances between the nanopatterns 54a and 54b are adjustable. The distances between the nanopatterns 54a and 54b may be adjusted by deforming the lower structure 10. When the lower structure 10 is formed of a flexible material such as polymer, the lower structure 10 may be mechanically deformed to change a length d1 and/or d2 of the lower structure 10. Also, a material such as an organic solvent may be absorbed into or discharged from the lower structure 10 to swell or shrink the lower structure 10 and to thereby change the length d1 and/or d2. For example, the lower structure 10 may be formed of polydimethylsiloxane (PDMS), and then the two-dimensional material layer 12 and the nanopatterns 54a and 54b may be formed on the lower structure 10. Then, when an organic solvent such as acetone is absorbed into the lower structure 10, the lower structure 10 may be deformed three-dimensionally. As the organic solvent is absorbed into the lower structure 10 so that the lower structure 10 is swelled, distances between the nanopatterns 54a and 54b may be increased. On the contrary, when the organic solvent is discharged from the lower structure 10, the lower structure 10 may be shrunk and the distances between the nanopatterns 54a and 54b may be reduced.

Although the nanopatterns 54a and 54b including spherical nanopatterns 54a and rod-shaped nanopatterns 54b are illustrated in FIG. 9, this is exemplary, and only spherical nanopatterns 54b may be formed on the two-dimensional material layer 12. The spherical nanopatterns 54b may include nanopatterns having different sizes. Also, the distances between the nanopatterns 54a and 54b may be formed to have a predetermined initial distance between one another, and the distances between all of the nanopatterns 54a and 54b may be uniformly increased or reduced or distances between only some of the nanopatterns 54a and 54b may be increased or reduced according to deformation of the lower structure 10. By adjusting the distances between the nanopatterns 54a and 54b, a range of localized surface plasmon resonance (LSPR) frequency may be changed.

Figure 10:
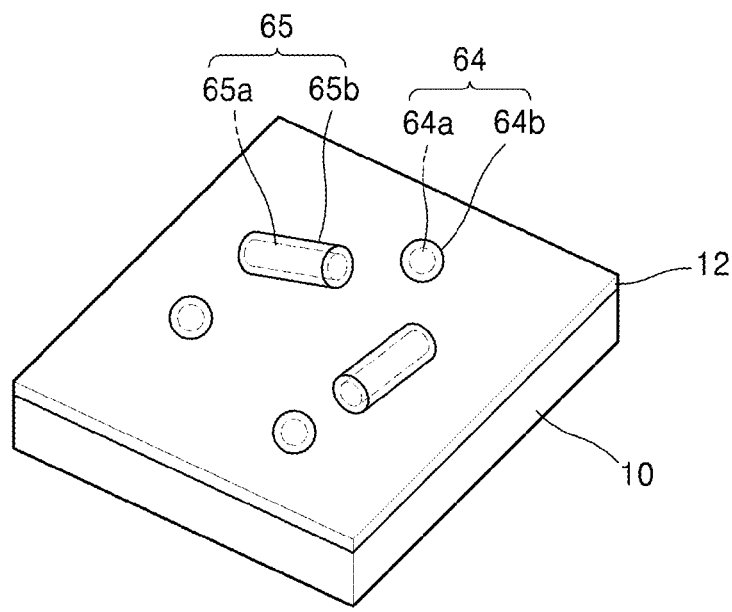
FIG. 10 illustrates a nanostructure including nanopatterns having a core-shell structure.

FIG. 10 illustrates a nanostructure including nanopatterns having a core-shell structure.

Referring to FIG. 10, the nanostructure may include a lower structure 10, a two-dimensional material layer 12 formed on the lower structure 10, and nanopatterns 64 and 65 formed on the two-dimensional material layer 12. The nanopatterns 64 and 65 may have various forms. For example, the nanopatterns 64 and 65 may include a spherical nanopattern 64 having a core-shell structure and rod-shaped nanopatterns 65 having a core-shell structure. A core region 64a and a shell region 64b of the spherical nanopatterns 64 may be formed of different materials; for example, the core region 64a may be formed of Ag, and the shell region 64b may be formed of Au. However, this is exemplary, and in the other way around, the core region 64a may be formed of Au, and the shell region 64b may be formed of Ag. The spherical nanopatterns 64 having a core-shell structure in which an outer portion of the core region 64a is completely surrounded by the shell region 64b are illustrated, but the exemplary embodiments are not limited thereto. That is, like the rod-shaped nanopatterns 65, a core region 65a may be surrounded by a shell region 65b and a portion of the core region 65a, that is, two end portions thereof may be exposed to the outside. While the nanopatterns 64 and 65 both having a core-shell structure are illustrated in FIG. 10, the exemplary embodiments are not limited thereto. Alternatively, some of the nanopatterns 64 and 65 formed on the two-dimensional material layer 12 may have a core-shell structure.

When the nanopatterns 64 and 65 have a core-shell structure, and the core regions 64a and 65a and the shell regions 64b and 65b are formed of different materials from each other, a degree of freedom of wavelength tuning of a multi-plasmon band may be increased compared to nanopatterns formed of an identical material.

Figure 11:
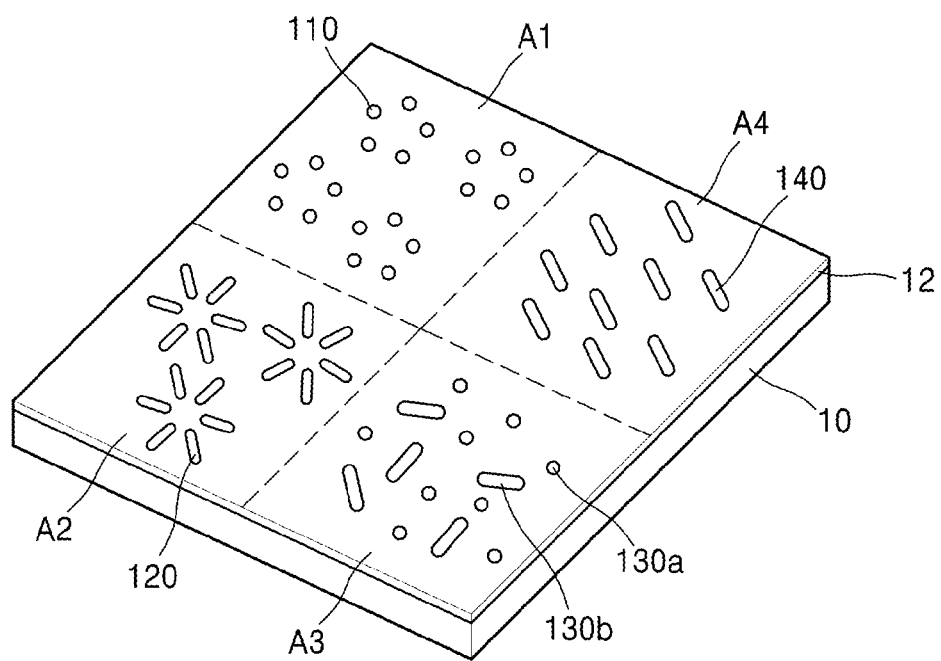
FIG. 11 illustrates a nanostructure including nanopatterns formed in a plurality of regions.

FIG. 11 illustrates a nanostructure including nanopatterns formed in a plurality of regions.

Referring to FIG. 11, the nanostructure may include a lower structure 10, a two-dimensional material layer 12 formed on the lower structure 10, and nanopatterns 110, 120, 130a, 130b, and 140 formed on the two-dimensional material layer 12 in multiple regions A1, A2, A3, and A4. As the nanopatterns 110, 120, 130a, 130b, and 140 having various shapes and sizes according to the regions A1, A2, A3, and A4 of the two-dimensional material layer 12 are included, various multi-plasmon bands may be arranged at different positions of the nanostructure.

The nanopatterns 110, 120, 130a, 130b, and 140 in the regions A1, A2, A3, and A4 may have, without limitation, the same or different shapes. For example, FIG. 11 illustrates that spherical nanopatterns 110 are formed in a first region A1, and rod-shaped nanopatterns 120 are aligned in a second region A2, and rod-shaped nanopatterns 140 are aligned in a fourth region A4 in one direction. However, the exemplary embodiments are not limited thereto, and the nanopatterns 110, 120, and 140 may have the same shape but different sizes. Also, as in a third region A3, nanopatterns 130a and 130b having different shapes and sizes such as spherical nanopatterns 130a and rod-shaped nanopatterns 130b may be formed in a single region.

According to the exemplary embodiments described herein, a multi-band or ultra-broadband plasmonic optical device may be manufactured.

According to exemplary embodiments described herein, a nanostructure including nanopatterns having different shapes may be formed on a two-dimensional material layer such as graphene. Also, a method of manufacturing a nanostructure, having various shapes, on a two-dimensional material layer may be provided. In addition, according to exemplary embodiments described herein, an optical device including a nanopattern formed on a two-dimensional material layer such as a broadband photodetector may be provided.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the present invention as defined by the following claims.

What is claimed is:

1. A nanostructure comprising:
a two-dimensional material layer;
a plurality of first nanopatterns formed on the two-dimensional material layer; and
a plurality of second nanopatterns formed on the two-dimensional material layer, wherein one of a shape and a size of the plurality of second nanopatterns is different from the one of the shape and the size of the plurality of first nanopatterns,
wherein the two-dimensional material layer is formed on a lower structure,
the lower structure is formed of a flexible material, and
a distance between the nanopatterns is adjusted as the lower structure is deformed.

2. The nanostructure of claim 1, wherein a shape of at least one of the plurality of first nanopatterns and the plurality of second nanopatterns is one of a spherical shape, a cube shape, a poly-pyramid shape, and a polygonal pillar shape.

3. The nanostructure of claim 1, wherein the plurality of first nanopatterns and the plurality of second nanopatterns are formed of a same material.

4. The nanostructure of claim 1, wherein the shape of the plurality of first nanopatterns is different from the shape of the plurality of second nanopatterns.

5. The nanostructure of claim 1, wherein the plurality first nanopatterns are spherical and the plurality of second nanopatterns are rod-shaped.

6. The nanostructure of claim 1, wherein the plurality of first nanopatterns and the plurality of second nanopatterns are formed of a material selected from a group consisting of Au, Ag, Cu, Cr, Pt, Pd, an alloy of Au, an alloy of Ag, an alloy of Cu, an alloy of Cr, and alloy of Pt, and an alloy of Pd.

7. The nanostructure of claim 1, wherein the lower structure is deformed mechanically or as an organic solvent is absorbed into or discharged from the lower structure.

8. The nanostructure of claim 1, wherein at least one of the plurality of first nanopatterns and plurality of second nanopatterns has a core-shell structure.

9. The nanostructure of claim 1, wherein the two-dimensional material layer includes a plurality of regions, and nanopatterns formed in the respective regions have different shapes or sizes.

10. A nanostructure comprising:
a two-dimensional material layer; and
a plurality of nanopatterns that are formed on the two-dimensional material layer;
wherein the plurality of nanopatterns comprise nanopatterns that are formed substantially in one direction,
wherein the two-dimensional material layer is formed on a lower structure,
the lower structure is formed of a flexible material, and
a distance between the nanopatterns is adjusted as the lower structure is deformed.

11. The nanostructure of claim 10, wherein the nanopatterns are rod-shaped.

12. An optical device comprising:
a two-dimensional material layer;
a plurality of first nanopatterns formed on the two-dimensional material layer;
a plurality of second nanopatterns formed on the two-dimensional material layer, wherein one of a shape and a size of the plurality of second nanopatterns is different from the one of the shape and the size of the plurality of first nanopatterns;
a first electrode in contact with the two-dimensional material layer; and
a second electrode in contact with the two-dimensional material layer,
wherein the two-dimensional material layer is formed on a lower structure,
the lower structure is formed of a flexible material, and
a distance between the nanopatterns is adjusted as the lower structure is deformed.

13. The optical device of claim 12, wherein a shape of at least one of the plurality of first nanopatterns and the plurality of second nanopatterns is one of a spherical shape, a cube shape, a poly-pyramid shape, and a polygonal pillar shape.

* * * * *